US010769936B2

(12) United States Patent
Kull

(10) Patent No.: US 10,769,936 B2
(45) Date of Patent: Sep. 8, 2020

(54) SENSOR DATA TRANSMISSION SYSTEM

(71) Applicant: UTC Fire & Security EMEA BVBA, Diegem (BE)

(72) Inventor: Andreas Dittmar Kull, Rummen (BE)

(73) Assignee: UTC FIRE & SECURITY EMEA BVBA, Diegem (BE)

(*) Notice: Subject to any disclaimer, the term of this patent is extended or adjusted under 35 U.S.C. 154(b) by 0 days.

(21) Appl. No.: 16/315,878

(22) PCT Filed: Jul. 7, 2017

(86) PCT No.: PCT/EP2017/067137
§ 371 (c)(1),
(2) Date: Jan. 7, 2019

(87) PCT Pub. No.: WO2018/007609
PCT Pub. Date: Jan. 11, 2018

(65) Prior Publication Data
US 2019/0340917 A1 Nov. 7, 2019

Related U.S. Application Data

(60) Provisional application No. 62/359,442, filed on Jul. 7, 2016.

(30) Foreign Application Priority Data

Jun. 17, 2016 (GB) .................... 1610642.9

(51) Int. Cl.
G08B 29/00 (2006.01)
G08B 29/08 (2006.01)
(Continued)

(52) U.S. Cl.
CPC ............. G08B 29/08 (2013.01); C08F 12/32 (2013.01); G08B 29/188 (2013.01);
(Continued)

(58) Field of Classification Search
CPC .... G08B 29/08; G08B 26/002; G08B 26/005; G08B 25/04; G08B 25/08; G08B 19/00
(Continued)

(56) References Cited

U.S. PATENT DOCUMENTS 4,148,019 A 4/1979 Durkee
4,394,655 A 7/1983 Wynne et al.
(Continued)

FOREIGN PATENT DOCUMENTS

DE 2836760 A1 3/1980
DE 4104590 A1 8/1991
(Continued)

OTHER PUBLICATIONS

ISR/WO, dated Nov. 20, 2017 for related International Application No. PCT/EP2017/067137; 13 pages.

Primary Examiner — Toan N Pham
(74) Attorney, Agent, or Firm — Cantor Colburn LLP

(57) ABSTRACT

A sensor data transmission system includes a central processor, first and second sensor assemblies, and first and second conductors. The sensor assemblies each include a sensor, a processor and a relay. The sensor is configured to detect a condition. The processor is configured to receive a condition detected signal from the sensor and open the respective relay at least once indicative of the condition and within a pre-determined time interval. The first conductor is electrically in contact with the processors of the first and second sensor assemblies and is interposed by the relay of the second sensor assembly. The second conductor is electrically in contact with the central processor and the processor of the first sensor assembly and is interposed by the relay of the first sensor assembly.

17 Claims, 3 Drawing Sheets

(51) Int. Cl.
*G08B 29/18* (2006.01)
*C08F 12/32* (2006.01)
*H01L 51/00* (2006.01)
*H01L 51/52* (2006.01)
*H01L 51/50* (2006.01)

(52) U.S. Cl.
CPC ...... *H01L 51/0003* (2013.01); *H01L 51/0035* (2013.01); *H01L 51/0039* (2013.01); *H01L 51/5268* (2013.01); *H01L 51/5072* (2013.01); *H01L 51/5092* (2013.01); *H01L 2251/5369* (2013.01); *H01L 2251/552* (2013.01)

(58) Field of Classification Search
USPC .................................................. 340/508, 541
See application file for complete search history.

(56) References Cited

U.S. PATENT DOCUMENTS

| | | | |
|---|---|---|---|
| 4,446,454 A | | 5/1984 | Pyle |
| 4,755,792 A | | 7/1988 | Pezzolo et al. |
| 6,191,688 B1 * | | 2/2001 | Sprouse ............... G08B 13/191 340/506 |
| 6,611,204 B2 * | | 8/2003 | Schmurr ................ G08B 25/04 340/3.1 |
| 6,868,493 B2 | | 3/2005 | Orlando et al. |
| 7,376,704 B2 | | 5/2008 | Wellons et al. |
| 7,616,109 B2 * | | 11/2009 | McCulloch .......... G08B 29/046 324/555 |
| 7,844,353 B2 | | 11/2010 | Bejean et al. |
| 8,339,271 B2 | | 12/2012 | Tabib |
| 8,391,277 B2 | | 3/2013 | Sharma et al. |
| 8,854,187 B2 | | 10/2014 | Motta |
| 8,890,034 B2 | | 11/2014 | Mishra |
| 2003/0061325 A1 | | 3/2003 | Monroe |
| 2006/0158327 A1 | | 7/2006 | Fuchs |
| 2007/0025240 A1 | | 2/2007 | Snide |
| 2008/0238651 A1 * | | 10/2008 | Kucharyson ........... G08B 21/12 340/506 |

FOREIGN PATENT DOCUMENTS

| | | |
|---|---|---|
| DE | 102009050692 A1 | 4/2011 |
| GB | 2220510 A | 1/1990 |
| GB | 2504916 A | 2/2014 |
| WO | 2012119253 A1 | 9/2012 |

* cited by examiner

SENSOR DATA TRANSMISSION SYSTEM

CROSS-REFERENCE TO RELATED APPLICATIONS

This application claims the benefit of PCT/EP2017/067137 filed Jul. 7, 2017, which claims priority to U.S. Provisional Application No. 62/359,442 filed Jul. 7, 2016, which is incorporated herein by reference in its entirety.

BACKGROUND

The present disclosure relates to a sensor data transmission system, and more particularly, to a sensor data transmission system for a security control system.

Sensor data transmission systems such as those utilized for security control systems may include a plurality of sensors that may each be hard-wired to a central control panel. Moreover, each sensor may be configured to send a variety of condition signals (e.g., alarm tamper, masking walktest) to the control panel with each type of condition needing a dedicated wire/conductor routed to the control panel. The resulting abundance of wires may introduce issues with cost and system robustness. Moreover, retrofitting such systems may not be practical.

SUMMARY

A sensor data transmission system according to one, non-limiting, embodiment includes a central processor; a first sensor assembly including a first sensor, a first processor and a first relay, wherein the first sensor is configured to detect a first condition, the first processor is configured to receive a first condition detected signal from the first sensor and open the first relay at least once indicative of the first condition and within a first pre-determined time interval; a second sensor assembly including a second sensor, second processor and a second relay, wherein the second sensor is configured to detect a second condition, the second processor is configured to receive a second condition detected signal from the second sensor and open the second relay at least once indicative of the second condition and within a second pre-determined time interval; a first communication conductor in electrical contact between the first and second processors and interposed by the second relay; and a second communication conductor in electrical contact between the central processor and the first processor and interposed by the first relay.

Additionally to the foregoing embodiment, the first and second conditions are the same.

In the alternative or additionally thereto, in the foregoing embodiment, the first and second pre-determined time intervals are the same.

In the alternative or additionally thereto, in the foregoing embodiment, the first and second relays are digitally triggered.

In the alternative or additionally thereto, in the foregoing embodiment, the first and second sensors are motion sensors.

In the alternative or additionally thereto, in the foregoing embodiment, the central processor is part of a security control panel.

In the alternative or additionally thereto, in the foregoing embodiment, the first and second sensors are one of temperature sensors, particulate sensors, and gas sensors.

In the alternative or additionally thereto, in the foregoing embodiment, the sensor data transmission system includes a resistor interposed in the first conductor between the first relay and the central processor.

In the alternative or additionally thereto, in the foregoing embodiment, the first and second conditions include a tamper condition.

In the alternative or additionally thereto, in the foregoing embodiment, the first and second conditions include a masking condition.

A security control system according to another, non-limiting, embodiment includes a control panel; and a plurality of daisy-chained sensor assemblies in communication with the control panel over a single conductor, wherein each one of the plurality of daisy-chained sensor assemblies include a sensor, a processor and a relay, and wherein the sensor is configured to detect a condition, the processor is configured to receive a condition detected signal from the sensor and open the relay at least once indicative of the condition and within a pre-determined time interval.

Additionally to the foregoing embodiment, the sensor is a motion sensor.

In the alternative or additionally thereto, in the foregoing embodiment, the control panel includes a central processing unit electrically connected to the single conductor.

In the alternative or additionally thereto, in the foregoing embodiment, the single conductor is electrically connected to a first processor of a first sensor assembly of the plurality of daisy-chained sensor assemblies, and a first relay of the first sensor assembly interposes the first conductor.

In the alternative or additionally thereto, in the foregoing embodiment, the condition includes a tamper condition.

In the alternative or additionally thereto, in the foregoing embodiment, the condition includes a masking condition.

In the alternative or additionally thereto, in the foregoing embodiment, the processor includes a condition module and at least one of a tamper module, a walktest module, and a condition transfer module.

The foregoing features and elements may be combined in various configurations without exclusivity, unless expressly indicated otherwise. These features and elements as well as the operation thereof will become more apparent in light of the following description and the accompanying drawings. However, it should be understood that the following description and drawings are intended to be exemplary in nature and non-limiting.

BRIEF DESCRIPTION OF THE DRAWINGS

Various features will become apparent to those skilled in the art from the following detailed description of the disclosed non-limiting embodiments. The drawings that accompany the detailed description can be briefly described as follows.

DETAILED DESCRIPTION

Figure 1:
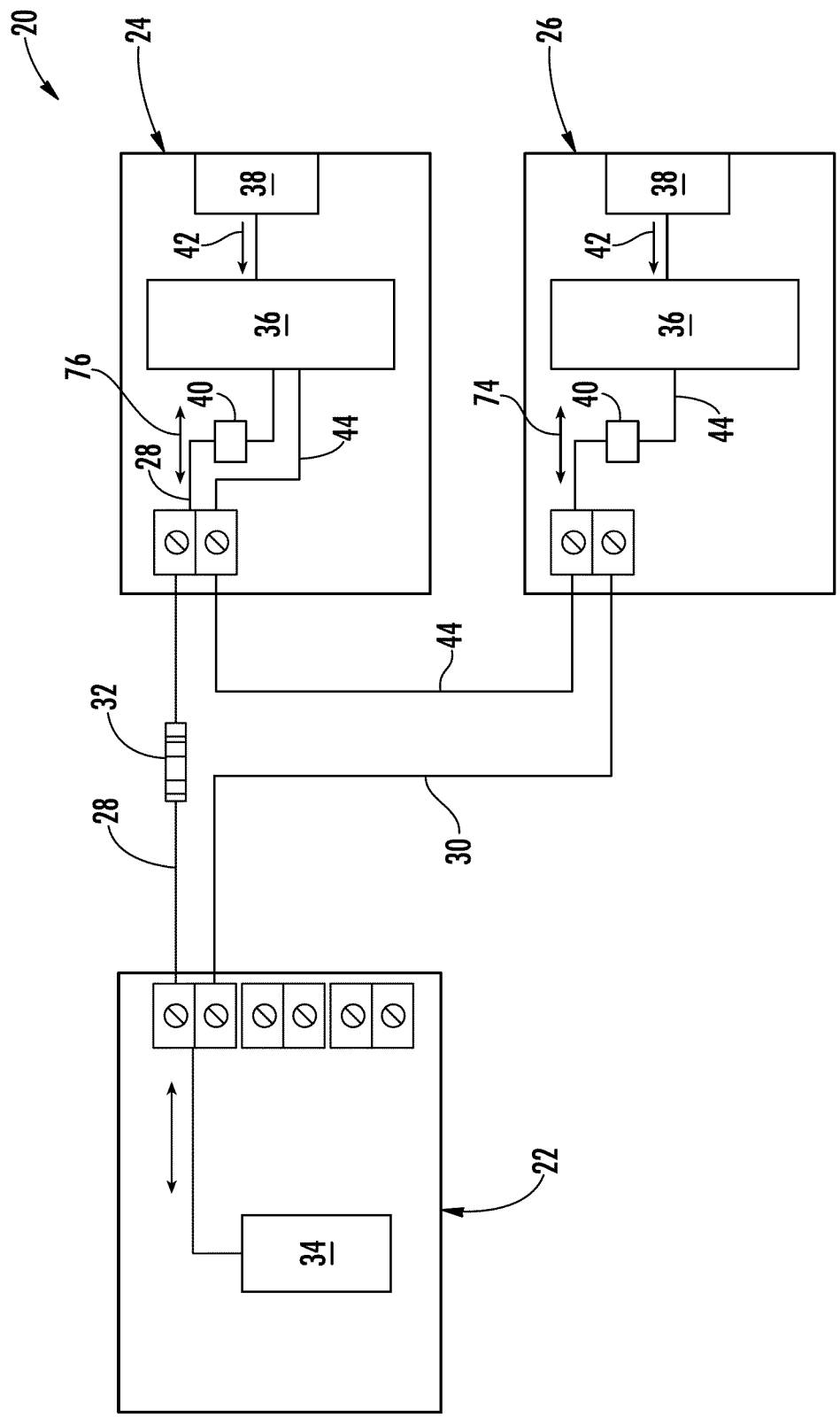
FIG. 1 is a schematic of a sensor data transmission system as one, non-limiting, exemplary embodiment of the present disclosure.

Referring to FIG. 1, an exemplary embodiment of a sensor data transmission system 20 is illustrated that may be applied to a security control system as one, non-limiting, example. The sensor data transmission system 20 may include a control panel 22, a plurality of sensor assemblies (i.e., two illustrated as 24 and 26), a communication transmission conductor 28 that may be an electrically insulated wire, a communication neutral conductor 30 that may be an electrically insulated wire, and a resistor 32. The control panel 22 may include a central processing unit (CPU) 34 that may be computer based for receiving and transmitting communications to the sensor assemblies 24, 26 over the transmission conductor 28. Depending on the type of sensor data transmission system 20, the control panel 22 may be configured to alert, for example, occupants of a building of a condition detected by the sensor assemblies 24, 26 and may be used to further control the assemblies. It is contemplated and understood that the sensor data transmission system 20 may be part of a building management system and/or may be a fire or smoke detection system, a gas detection system or any other type of detection systems. Although not illustrated, each sensor assembly 24, 26 may be electrically powered directly from the control panel 22 utilizing dedicated power wires.

Each sensor assembly 24, 26 may include a processor 36 (e.g., microprocessor), a sensor 38, and a relay 40. The sensor 38 is configured to detect any variety of conditions, such as for example, motion, and transmit the detected condition as a condition detected signal (see arrow 42) to the processor 36. The processors 36 of each sensor assembly 24, 26 are generally, electrically, daisy-chained together. That is, the processors 36 may be interconnected by a communication conductor 44. When assembled, the relay 40 of the first sensor assembly 24 interposes the communication transmission conductor 28, and the relay 40 of the second sensor assembly 26 interposes the communication conductor 44. The processor 36 may be preprogrammed to process the condition detected signal 42 and in accordance with preprogramming, open and close the relay 40 thereby controlling the continuity of the respective conductors 28, 44. Non-limiting examples of sensors 38 may be configured to measure and/or detect motion, temperature, particulate, humidity, gas concentrations, noise and other factors.

The resistor 32 may be in the communication transmission conductor 28 and generally disposed between the relay 40 of the first sensor assembly 24 and the CPU 34. The resistor 32 generally facilitates supervision of the conductor loop (i.e., the conductors 28, 30, 44) to verify the conductor are not physically damaged or broken.

Figure 2:
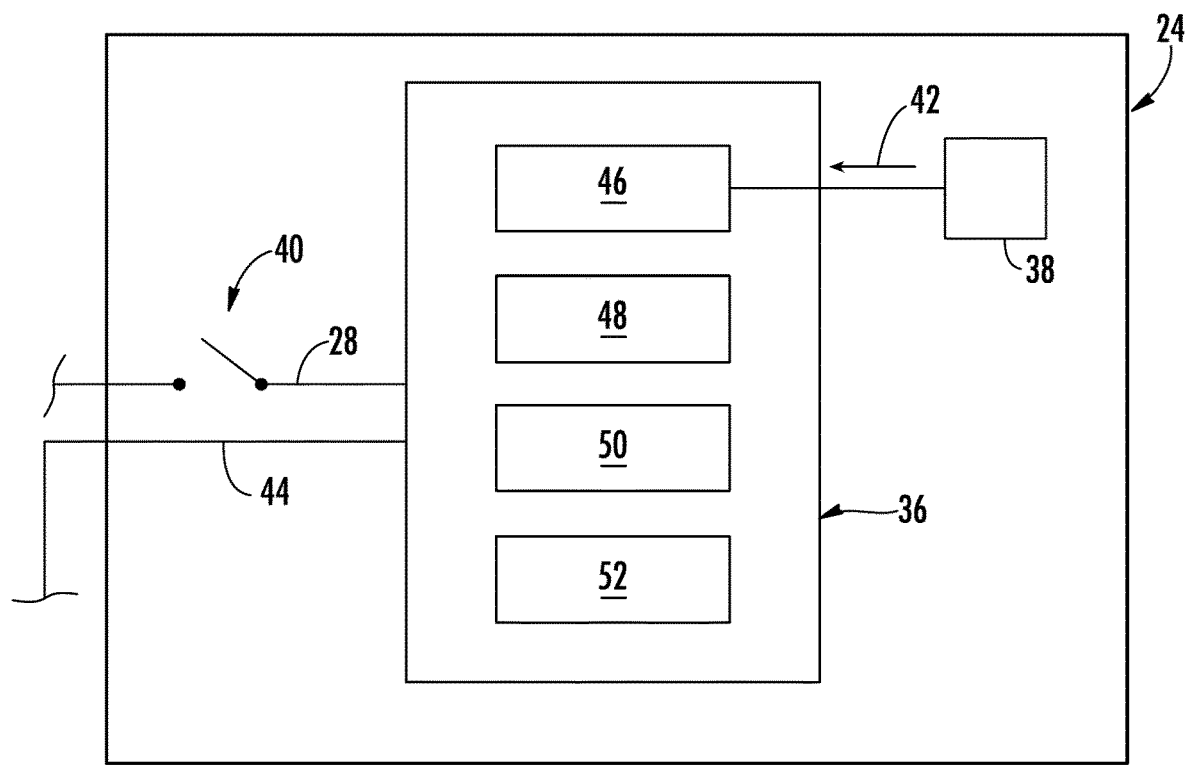
FIG. 2 is a schematic of a sensor assembly of the sensor data transmission system.

Referring to FIG. 2, each processor 36 of each sensor assembly 24, 26 may include a programmable alarm or condition module 46, a tamper module 48, a walktest module 50 and a condition transfer module 52. Each module 46, 48, 50, 52 is configured to generate a unique output signal (i.e., via the relay 40) to the CPU 34 of the control panel 22. The alarm module 46 may be generally applied during normal operation of the sensor data transmission system 20, and thus utilizes the condition detected signal 42 to process an appropriate response. The tamper module 48 (which may also be or includes a masking module) is associated with the ability of the sensor assemblies 24, 26 to detect tampering with a particular assembly. Examples of tampering may include an assembly cover is open, maintenance operations to an assembly are underway, a particular assembly is out of service (i.e., masking), and others. The walktest module 50 may be a means of performing an assembly self-test. The condition transfer module 52 facilitates the ability of the plurality of sensor assemblies 24, 26 to communicate with one-another in terms of, for example, which assembly detected a condition. It is understood and contemplated that the modules 46, 48, 50, 52 may be software based.

Figure 3:
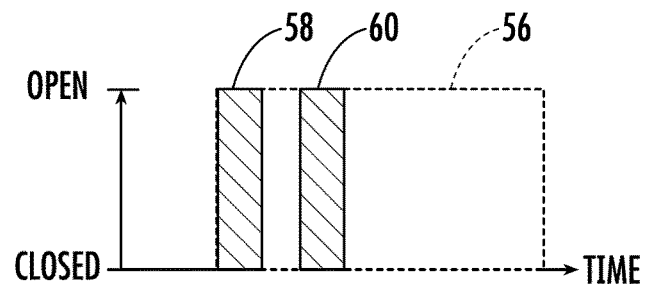
FIG. 3 is a graph illustrating peak pattern over a predetermined time interval indicative of a detected condition processed by a condition module of a processor of the sensor assembly.
Figure 4:
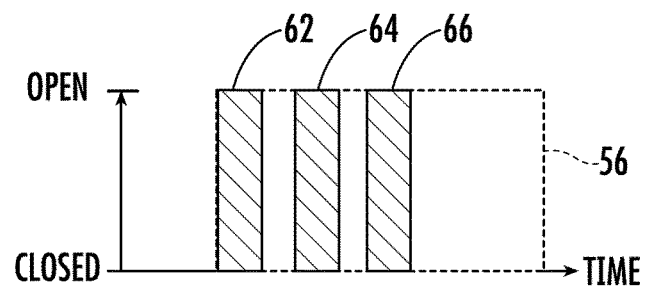
FIG. 4 is a graph illustrating another peak pattern over the predetermined time interval indicative of a tamper condition processed by a tamper module of the processor.
Figure 5:
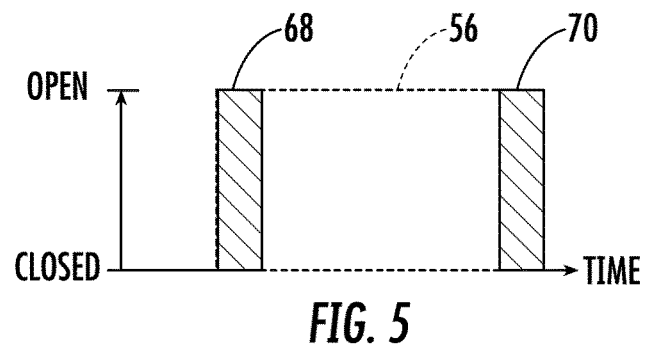
FIG. 5 is a graph illustrating another peak pattern over the predetermined time interval indicative of a walktest condition processed by a walktest module of the processor.
Figure 6:
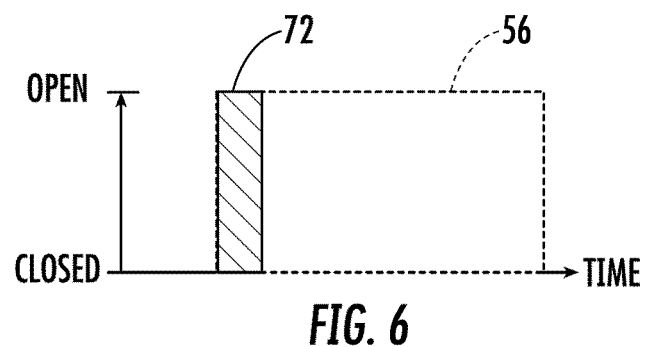
FIG. 6 is a graph illustrating another peak pattern over the predetermined time interval indicative of sensor data transfer of a sensor condition transfer module of the processor.

Referring to FIGS. 3 through 6, a relay open versus time graphs are illustrated. Each graph generally depicts a time window or interval 56 that may be predetermined and preprogrammed into the processors 36 of the sensor assemblies 24, 26. In FIG. 3, the relay 40 is briefly opened twice (i.e. illustrated as first and second peaks 58, 60 in what may be timed succession) and starting at the initiation of the time interval 56. This peak pattern may be associated with a condition detected and generated by the alarm module 46. In FIG. 4, the relay 40 is briefly opened three times producing three peaks 62, 64, 66 in timed succession and during the time interval 56. This peak pattern may be associated with an assembly tampering occurrence and generated by the tamper module 48. In FIG. 5, the relay 40 may be briefly opened two times producing two peaks 68, 70 with the first peak 68 being at the initiation of the time interval 56 and the second peak being at the end of the time interval (i.e., not necessarily in timed succession). This peak pattern may be associated with a sensor assembly self-test occurrence and is generated by the walktest module 50. In FIG. 6, the relay 40 may be briefly opened once producing a single peak 72 with the peak being at the initiation of the time interval 56. This peak pattern may be associated with a communication between sensor assemblies and may be generated by the condition transfer module 52. More specifically and as one example, if the sensor assembly 26 detects a condition, the condition transfer module 52 may request from the first sensor assembly 24 to confirm the detection. It is further contemplated and understood that any type of module may generate any number of peak patterns within the time interval 56 and associated with a particular function or event as programmed within the processors 36. It is contemplated and understood that the various peak patterns may be reflective of a digital process and/or digital signals.

In operation of the sensor data transmission system 20, the sensor 38 may monitor for a condition and send a signal 42 to the processor 36 of the sensor assembly 24. The signal 42 may be continuously sent and the condition module 46 of the processor 36 may process the signal 42 and/or monitor the signal until a preprogrammed threshold is reached indicative of, for example, an alarm condition. Alternatively, the sensor 38 may send a signal 42 only when a condition has occurred. Upon recognizing the condition, the condition module 46 may initiate the time interval 56 while controlling the relay 40. The control of the relay 40 may be opening the relay, twice, in succession, beginning at initiation of the time interval 56 (see FIG. 3). Opening the relay twice within the time interval 56 produces a two peak pattern that is generally associated with a specific output continuity signal (see arrow 74 in FIG. 1).

If the condition occurs at the sensor assembly 26, the continuity signal 74 is transmitted to the processor 36 of the sensor assembly 24, where it may then be assigned an address indicative of sensor assembly 26, and then sent to the CPU 34 of the control panel 22 in, for example, real time (i.e., before the time interval 56 has expired). In this example the processors 36 of the sensor assemblies 24, 26 may include an internal clock. Alternatively, or in addition too, the CPU 34 may include an internal clock and receives the peak patterns in real time. Upon expiration of the time interval 56 as determined by the CPU 34, the CPU 34 may then determine the meaning of the input signal (see arrow 76) from the sensor assembly 24 (i.e., from which module 46, 48, 50, 52 and which assembly 24, 26). In one embodiment, the condition detected by the second sensor assembly 26, and sensed by the first sensor assembly 24 via opening of the relay 40 may be processed by the processor 36 of the first sensor assembly 24 and communicated to the CPU 34 via opening of the relay 40 of the first sensor assembly 24 which is detected by the CPU 34. In another embodiment, when the first sensor assembly 24 sees the opening of the relay 40 of the second sensor assembly 26, the processor 36 of the first sensor assembly 24 may not open its relay. Instead, the sensor assembly 24 may send an electronic signal to the CPU 34 over conductor 28 indicative of the condition detected by the second sensor assembly 26.

The CPU 34 may be configured to monitor input from the first sensor assembly 24 to determine if there is any change in the input, once there is a change, the CPU 34 may listen over the duration of the time interval 56, which in one example may be about two hundred (200) milliseconds, to identify the specific continuity signal (i.e., peak pattern). The CPU 34 needs to identify the specific continuity signal to differentiate between, for example, an alarm condition from the condition module 46, a tamper condition from the tamper module 48, a walktest condition from the walktest module 50, and a transfer of information occurring between assemblies from the condition transfer module 52. As described above for operation of sensor data transmission system 20 generally specific to the condition module 46, the same process may be applied to the modules 48, 50.

Relative to the condition transfer module 52, and in the case of a dual sensor alarm verification, the first sensor assembly 24 may create a peak pattern (see FIG. 6 as one example). The CPU 34 may see this pattern in real time, but does not react since its meaning is not yet known. Also, sensor assembly 26 may also see the peak pattern from the sensor assembly 24 and may be configured to confirm if it also detects a condition, so the sensor assembly 26 waits through the duration of the time interval 56. If the second sensor assembly 26 also qualifies the condition, then the sensor assembly 26 signals back to the CPU 34 via the first sensor assembly 24.

Advantages and benefits of the present disclosure include a reduction in wiring. That is, traditional system may require dedicated wiring for each module 46, 48, 50, 52 to the CPU 34 and/or traditional system may require dedicated wiring from each sensor assembly to the CPU 34. In the present disclosure, such wiring is greatly reduced. Other advantages include simplification of retrofitting existing systems, a reduction in cost, and an increase in system robustness. Yet further, sensor assemblies are capable of talking to one-another to pre-qualify detected conditions for verification purposes.

While the present disclosure is described with reference to exemplary embodiments, it will be understood by those skilled in the art that various changes may be made and equivalents may be substituted without departing from the scope of the present disclosure. In addition, various modifications may be applied to adapt the teachings of the present disclosure to particular situations, applications, and/or materials, without departing from the essential scope thereof. The present disclosure is thus not limited to the particular examples disclosed herein, but includes all embodiments falling within the scope of the appended claims.

What is claimed is:

1. A sensor data transmission system comprising:
   a central processor;
   a first sensor assembly including a first sensor, a first processor and a first relay, wherein the first sensor is configured to detect a first condition, the first processor is configured to receive a first condition detected signal from the first sensor and open the first relay at least once indicative of the first condition and within a first pre-determined time interval;
   a second sensor assembly including a second sensor, second processor and a second relay, wherein the second sensor is configured to detect a second condition, the second processor is configured to receive a second condition detected signal from the second sensor and open the second relay at least once indicative of the second condition and within a second pre-determined time interval;
   a first communication conductor in electrical contact between the first and second processors and interposed by the second relay; and
   a second communication conductor in electrical contact between the central processor and the first processor and interposed by the first relay.

2. The sensor data transmission system set forth in claim 1, wherein the first and second conditions are the same.

3. The sensor data transmission system set forth in claim 2, wherein the first and second pre-determined time intervals are the same.

4. The sensor data transmission system set forth in claim 3, wherein the first and second relays are digitally triggered.

5. The sensor data transmission system set forth in claim 4, wherein the first and second sensors are motion sensors.

6. The sensor data transmission system set forth in claim 5, wherein the central processor is part of a security control panel.

7. The sensor data transmission system set forth in claim 4, wherein the first and second sensors are one of temperature sensors, particulate sensors, and gas sensors.

8. The sensor data transmission system set forth in claim 1, further comprising:
   a resistor interposed in the first conductor between the first relay and the central processor.

9. The sensor data transmission system set forth in claim 1, wherein the first and second conditions include a tamper condition.

10. The sensor data transmission system set forth in claim 1, wherein the first and second conditions include a masking condition.

11. A security control system comprising:
    a control panel; and
    a plurality of daisy-chained sensor assemblies in communication with the control panel over a single conductor, wherein each one of the plurality of daisy-chained sensor assemblies include a sensor, a processor and a relay, and wherein the sensor is configured to detect a condition, the processor is configured to receive a condition detected signal from the sensor and open the relay at least once indicative of the condition and within a pre-determined time interval.

12. The security control system set forth in claim 11, wherein the sensor is a motion sensor.

13. The security control system set forth in claim 11, wherein the control panel includes a central processing unit electrically connected to the single conductor.

14. The security control system set forth in claim 13, wherein the single conductor is electrically connected to a first processor of a first sensor assembly of the plurality of daisy-chained sensor assemblies, and a first relay of the first sensor assembly interposes the first conductor.

15. The security control system set forth in claim 14, wherein the condition includes a tamper condition.

16. The security control system set forth in claim 14, wherein the condition includes a masking condition.

17. The security control system set forth in claim 14, wherein the processor includes a condition module and at least one of a tamper module, a walktest module, and a condition transfer module.

* * * * *